US010782975B1

(12) United States Patent
Ishiwata

(10) Patent No.: US 10,782,975 B1
(45) Date of Patent: Sep. 22, 2020

(54) INFORMATION PROCESSING APPARATUS, DYNAMIC RECONFIGURATION DEVICE, AND NON-TRANSITORY COMPUTER READABLE MEDIUM

(71) Applicant: FUJI XEROX CO., LTD., Tokyo (JP)

(72) Inventor: Masahiro Ishiwata, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 16/751,919

(22) Filed: Jan. 24, 2020

(30) Foreign Application Priority Data

Aug. 29, 2019 (JP) .................. 2019-157304

(51) Int. Cl.
*G06F 13/40* (2006.01)
*G06F 9/38* (2018.01)
*G06F 9/50* (2006.01)
*G06F 30/34* (2020.01)

(52) U.S. Cl.
CPC .......... *G06F 9/3828* (2013.01); *G06F 9/3842* (2013.01); *G06F 9/5077* (2013.01); *G06F 13/4022* (2013.01); *G06F 30/34* (2020.01)

(58) Field of Classification Search
CPC .... G06F 9/3828; G06F 9/3842; G06F 9/5077; G06F 13/4022; G06F 30/34
See application file for complete search history.

(56) References Cited

U.S. PATENT DOCUMENTS

| 5,796,413 A * | 8/1998 | Shipp ................. G09G 5/39 345/522 |
| 7,574,482 B2 * | 8/2009 | Brown ............... G06F 12/0692 709/217 |
| 7,902,866 B1 * | 3/2011 | Patterson ................ G06F 30/34 326/41 |
| 8,997,033 B1 * | 3/2015 | Hew ....................... G06F 30/34 716/116 |
| 9,779,785 B2 * | 10/2017 | Li ............................. G11C 7/10 |
| 10,127,171 B2 * | 11/2018 | Reinig ................ G06F 13/4022 |
| 10,516,396 B2 * | 12/2019 | Coole ................. H03K 19/1731 |
| 2013/0093462 A1 * | 4/2013 | Teig ................... H03K 19/1736 326/38 |
| 2016/0007046 A1 * | 1/2016 | Chou ................... H04N 19/149 375/240.02 |
| 2016/0036998 A1 * | 2/2016 | Goda ................. H04N 1/00509 358/1.13 |
| 2020/0067637 A1 * | 2/2020 | Wang ..................... H04L 45/08 |

FOREIGN PATENT DOCUMENTS

| JP | 2009-237874 A | 10/2009 |
| JP | 2016-35692 A | 3/2016 |
| JP | 2017-129951 A | 7/2017 |

* cited by examiner

*Primary Examiner* — Alexander H Taningco
*Assistant Examiner* — Kurtis R Bahr
(74) *Attorney, Agent, or Firm* — Oliff PLC

(57) ABSTRACT

An information processing apparatus includes a dynamic reconfiguration device and a processor. The dynamic reconfiguration device has a first region with a static configuration, a second region with a changeable configuration, a switch used for bypassing between input and output terminals of the second region, and a crossbar switch used for switching a connection between the first region and the second region. The processor is configured to set a writing destination for a circuit to be reconfigured based on a resource to be used by the circuit if the circuit is to be written in the second region.

11 Claims, 11 Drawing Sheets

FIG. 6

| CONTENT OF PROCESS | CHARACTERISTICS OF RESOURCE | WRITING DESTINATION |
|---|---|---|
| EXPANSION PROCESS | HAS MEMORY ACCESS BUT SMALL AMOUNT OF CALCULATION | REGION A |
| GRADATION PROCESS | HAS BOTH LARGE AMOUNT OF MEMORY ACCESS AND CALCULATION | REGION B |
| SCREENING PROCESS | HAS NO MEMORY ACCESS BUT LARGE AMOUNT OF CALCULATION | REGION C |
| EDGING PROCESS | HAS BOTH LARGE AMOUNT OF MEMORY ACCESS AND CALCULATION | REGION B |

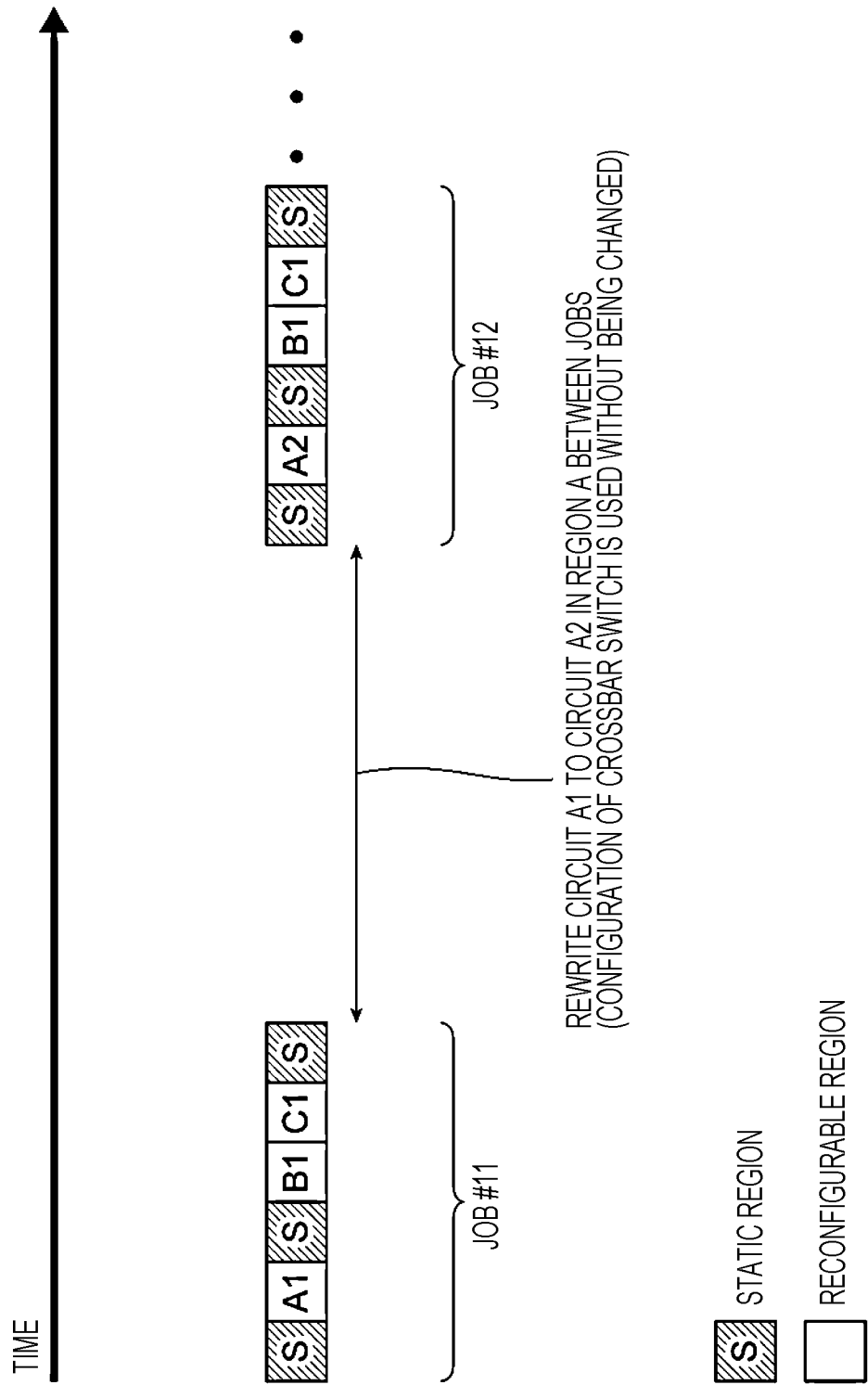

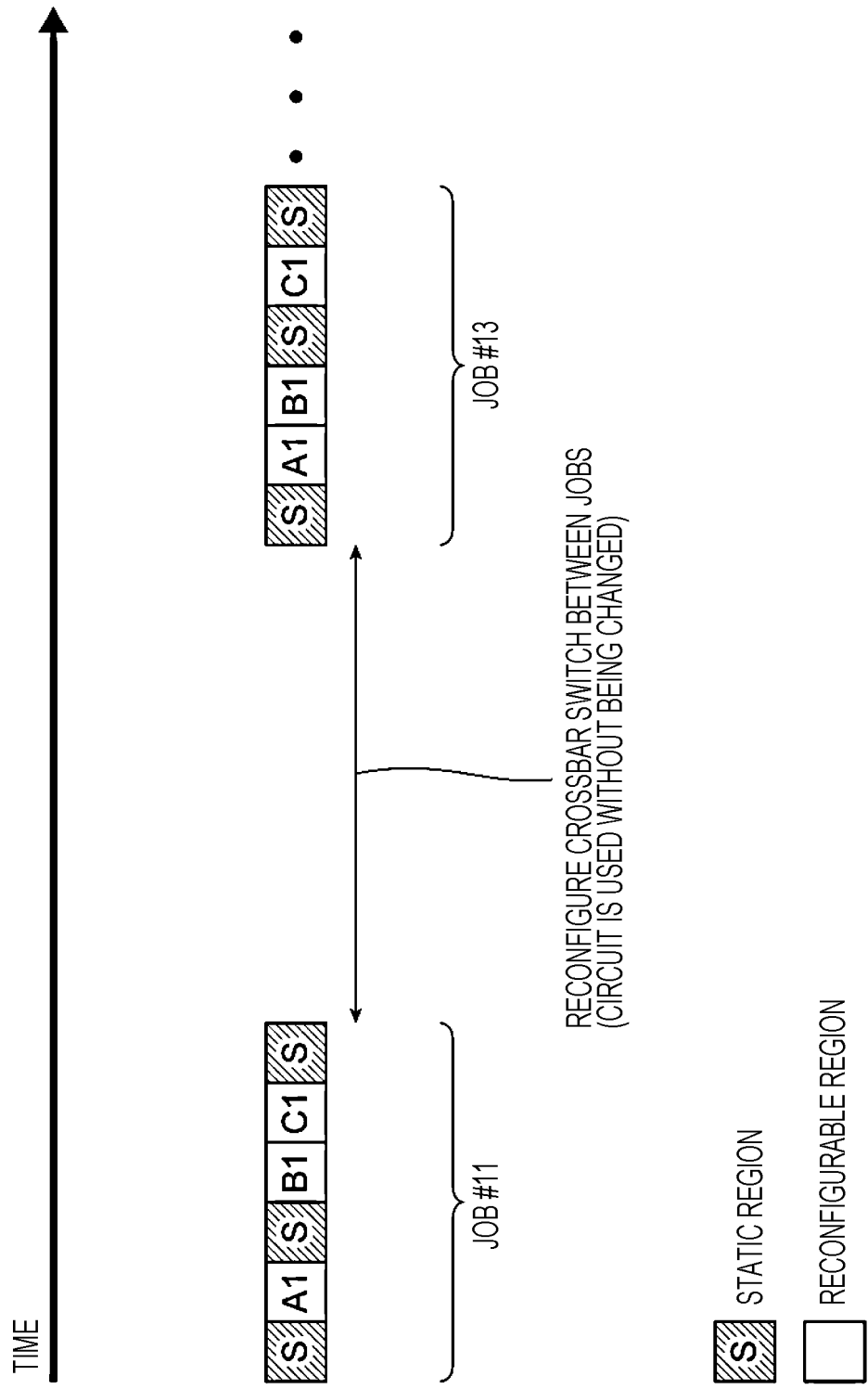

INFORMATION PROCESSING APPARATUS, DYNAMIC RECONFIGURATION DEVICE, AND NON-TRANSITORY COMPUTER READABLE MEDIUM

CROSS-REFERENCE TO RELATED APPLICATIONS

This application is based on and claims priority under 35 USC 119 from Japanese Patent Application No. 2019-157304 filed Aug. 29, 2019.

BACKGROUND

(i) Technical Field

The present disclosure relates to information processing apparatuses, dynamic reconfiguration devices, and non-transitory computer readable media.

(ii) Related Art

Predetermined processing may be executed at high speed by being executed in a logical circuit. On the other hand, preparing a dedicated logical circuit for every type of processing is uneconomical. Therefore, field-programmable gate arrays (FPGAs) that allow free editing of the configuration of logical circuits have been used. A typical FPGA is provided with a region where the purchaser or the designer may freely change the circuit configuration. For example, see Japanese Unexamined Patent Application Publication No. 2016-035692.

In regions other than the region where the configuration is changeable, circuits are disposed and wires are fixed. Therefore, a circuit to be reconfigured has to be written in the same region. Configuration-changeable regions prepared within an FPGA vary in size. Needless to say, it is not possible to write a circuit to be reconfigured in a region smaller than the size of the circuit. If there are multiple circuits to be selectively written in a single region, it may be necessary to satisfy the total number of resources required in the multiple circuits in which the resources of the respective regions are to be written.

However, when rewritable regions that satisfy the total number of resources required in the multiple circuits are prepared within the FPGA, the circuit size of the FPGA increases.

SUMMARY

Aspects of non-limiting embodiments of the present disclosure relate to an effective use of resources in configuration-changeable regions, unlike a case where configuration-changeable regions are prepared to satisfy the total number of resources required in multiple circuits to be selectively written in a single region.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided an information processing apparatus including a dynamic reconfiguration device and a processor. The dynamic reconfiguration device has a first region with a static configuration, a second region with a changeable configuration, a switch used for bypassing between input and output terminals of the second region, and a crossbar switch used for switching a connection between the first region and the second region. The processor is configured to set a writing destination for a circuit to be reconfigured based on a resource to be used by the circuit if the circuit is to be written in the second region.

BRIEF DESCRIPTION OF THE DRAWINGS

Exemplary embodiments of the present disclosure will be described in detail based on the following figures, wherein:

FIG. 6 is a table illustrating the relationship between the characteristics of a resource used by a circuit corresponding to a process constituting each job and a reconfigurable region used as a writing destination;

FIG. 10 illustrates a case where the image processor is reconfigured between jobs; and FIG. 11 illustrates another case where the image processor is reconfigured between jobs.

DETAILED DESCRIPTION

Exemplary embodiments of the present disclosure will be described below with reference to the drawings.

First Exemplary Embodiment

System Configuration

Figure 1:
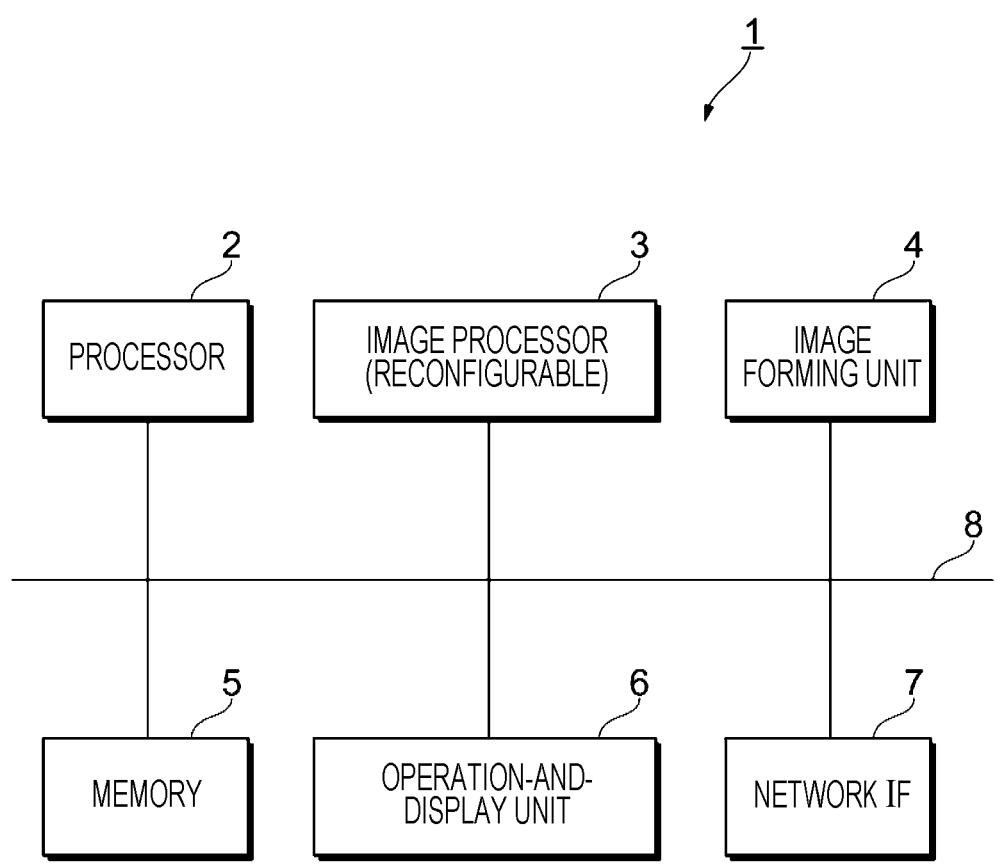
FIG. 1 illustrates a configuration example of an image forming apparatus used in a first exemplary embodiment.

FIG. 1 illustrates a configuration example of an image forming apparatus 1 used in a first exemplary embodiment. The image forming apparatus 1 forms an image onto a sheet or another type of medium. The sheet or another type of medium is determined in accordance with the intended usage of the image forming apparatus 1 or a selection made by a user. The image forming apparatus 1 is not limited to a business-oriented apparatus, and may alternatively be a personal apparatus.

The image forming apparatus 1 shown in FIG. 1 includes a processor 2 that controls each component of the apparatus, an image processor 3 that performs a process, such as a color correction or a gradation process, on image data, an image forming unit 4 that forms an image onto a medium, a memory 5 that stores image data, an operation-and-display unit 6 used for receiving an operation performed by an operator and for displaying information, and a network interface (IF) 7 that executes network communication. These components are connected by a signal line 8, such as a data bus, an address bus, or a peripheral-component-interconnect (PCI) bus.

The processor 2 realizes various types of functions by executing programs. The programs in this exemplary embodiment include not only firmware and an operating system, but also an application program.

The image processor 3 used in this exemplary embodiment is a circuit device that sequentially applies one or more predetermined processes to image data input from the memory 5. Specifically, in the image processor 3, circuits corresponding to the individual processes are connected in series. In other words, an output of a circuit corresponding to a certain process is used as an input of a circuit corresponding to a process to be subsequently executed. This type of process is called a pipeline process.

Furthermore, the image processor 3 in this exemplary embodiment is partially provided with regions where the contents of the circuits corresponding to the respective processes and the execution sequence among the circuits are changeable. In this exemplary embodiment, a circuit device having this configuration is referred to as a reconfigurable circuit device. In the case of this exemplary embodiment, the image processor 3 is constituted of, for example, an FPGA. The image processor 3 is an example of a dynamic reconfiguration device. In this exemplary embodiment, a dynamic reconfiguration device is capable of partially reconfiguring the circuit configuration during operation thereof.

The image forming unit 4 forms an image onto a medium, such as a sheet, based on an electrophotographic method or an inkjet method. The image forming unit 4 also includes a sheet transport device.

The memory 5 is constituted of a read-only memory (ROM) that stores therein firmware and a basic input output system (BIOS), a random access memory (RAM) used as a work area, and a hard disk device or a semiconductor memory that stores therein programs and image data.

The processor 2 mentioned above constitutes a computer by operating in cooperation with the memory 5.

The operation-and-display unit 6 is constituted of, for example, switches and buttons disposed on an operation panel, a liquid crystal display or an organic electroluminescence (EL) display used for displaying information, and a touch sensor that detects an operation performed by the operator on a software button displayed on the display.

The network IF 7 is used for communicating with an external apparatus via a network.

Specific Configuration of Each Component

Figure 2:
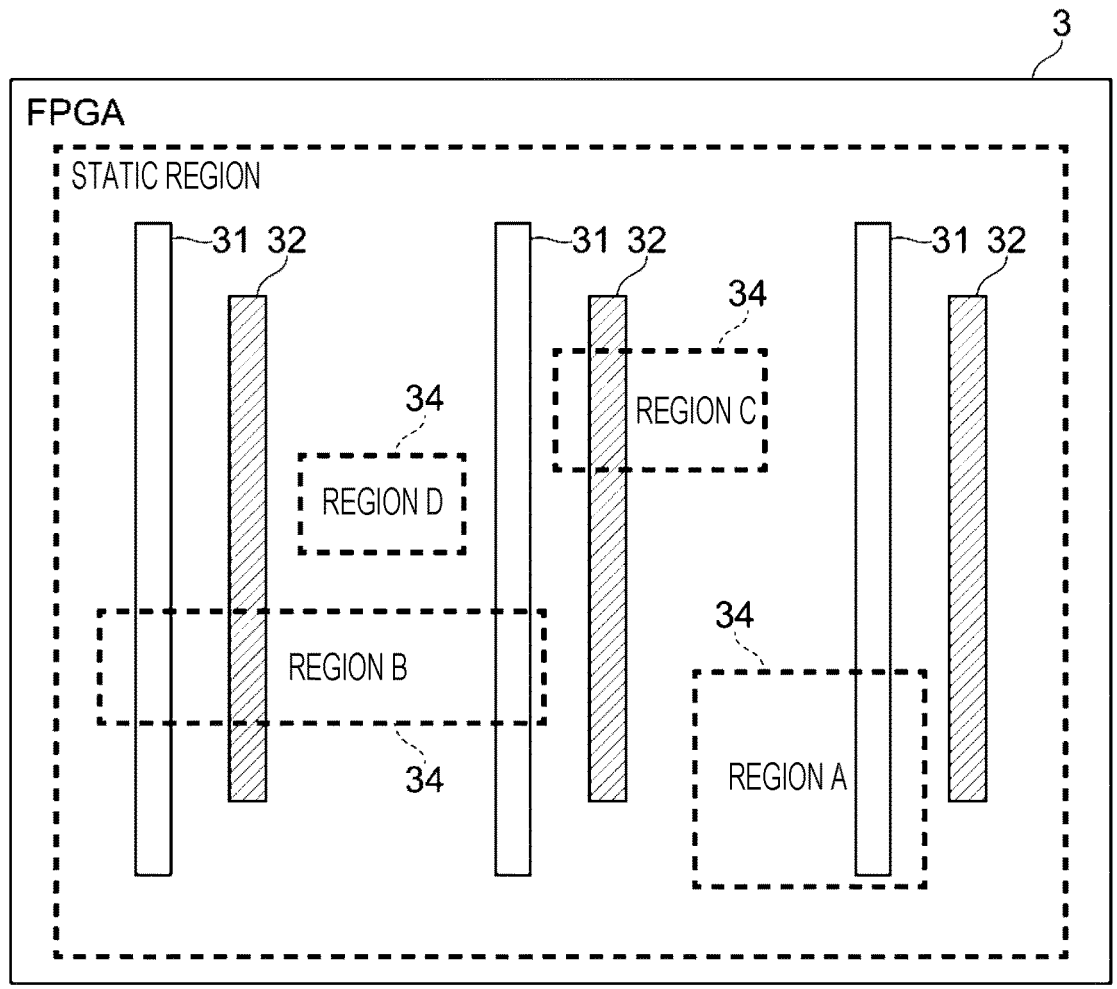
FIG. 2 schematically illustrates a configuration example of an image processor constituted of an FPGA.

FIG. 2 schematically illustrates a configuration example of the image processor 3 constituted of an FPGA. The image processor 3 shown in FIG. 2 is constituted of a region where the circuit configuration is static (referred to as "static region" hereinafter) and regions where ex-post rewriting of the circuit configuration is possible (referred to as "reconfigurable regions 34" hereinafter).

The static region is an example of a first region where the configuration is static, and each reconfigurable region 34 is an example of a second region where the configuration is changeable.

The static region has a circuit (referred to as "static circuit" hereinafter) corresponding to one or more processes, a memory region, a digital-signal-processor (DSP) region, a switch circuit 33 (see FIGS. 3A and 3B) that connects input and output terminals of each reconfigurable region 34, a data line, and an address line.

Figure 3A:
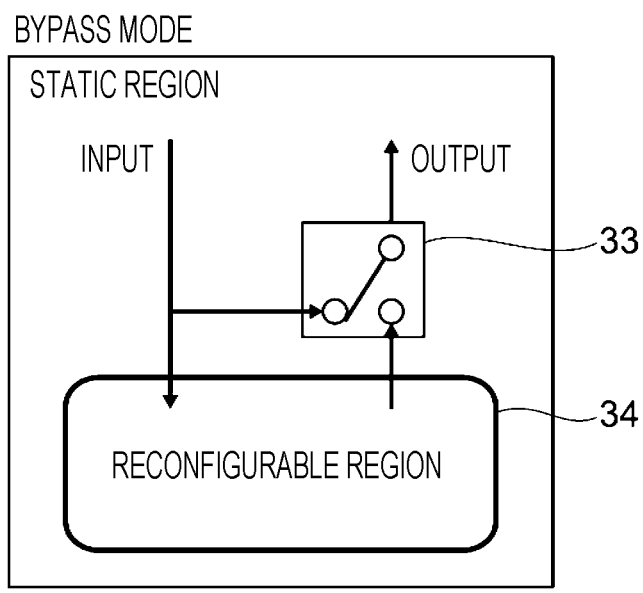
FIGS. 3A and 3B illustrate a switch circuit disposed in a static region, FIG. 3A illustrating the switch circuit controlled to a bypass mode and FIG. 3B illustrating the switch circuit controlled to a non-bypass mode.
Figure 3B:
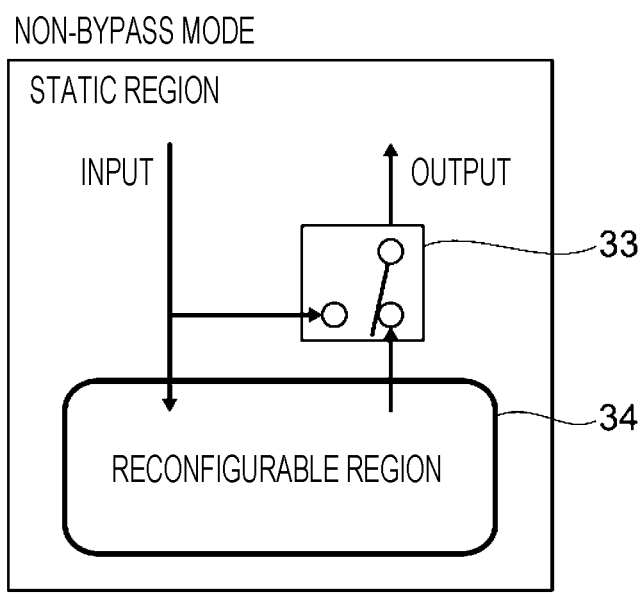

FIGS. 3A and 3B illustrate the switch circuit 33 disposed in the static region. Specifically, FIG. 3A illustrates the switch circuit 33 controlled to a bypass mode, and FIG. 3B illustrates the switch circuit 33 controlled to a non-bypass mode. A control line used for changing the switch of the switch circuit 33 also constitutes a part of the static region. The switch circuit 33 is an example of a switch used for bypassing between second regions.

As shown in FIGS. 3A and 3B, a first input terminal of the switch circuit 33 is connected to the input terminal of the reconfigurable region 34, whereas a second input terminal of the switch circuit 33 is connected to the output terminal of the reconfigurable region 34.

In the bypass mode, the switch of the switch circuit 33 is connected to the input terminal of the reconfigurable region 34. Therefore, data input to the reconfigurable region 34 appears as-is at the output terminal of the switch circuit 33.

In the non-bypass mode, the switch of the switch circuit 33 is connected to the output terminal of the reconfigurable region 34. Therefore, data processed by the reconfigurable region 34 appears at the output terminal of the switch circuit 33.

Referring back to FIG. 2, multiple reconfigurable regions 34 are disposed within the static region in the case of FIG. 2. In the case of FIG. 2, there are four reconfigurable regions 34. In FIG. 2, the reconfigurable regions 34 are distinguished from one another based on their characteristics of resources on hardware, and are expressed as a region A, a region B, a region C, and a region D respectively for the characteristics of the resources.

The region A is connected to a memory region 31 but is not connected to a DSP region 32. The region A is suitable for a circuit with memory access but with a small amount of calculation.

The region B is connected to both a memory region 31 and a DSP region 32. The region B is suitable for a circuit with both a large amount of memory access and a large amount of calculation.

The region C is connected to a DSP region 32 but is not connected to a memory region 31. The region C is suitable for a circuit with no memory access but with a large amount of calculation.

The region D is not connected to either a memory region 31 or a DSP region 32. The region D is used by a crossbar switch that sets a path for connecting the static region and the reconfigurable region 34.

Although four representative regions A, B, C, and D are shown in FIG. 2, each region may have multiple regions in actuality. Moreover, with regard to the area of each reconfigurable region 34 in the case of FIG. 2, the region A and the region B have substantially the same area, which is the largest, the region C has the second largest area, and the region D has the smallest area. However, the area relationship among the regions is not limited to the relationship shown in FIG. 2. Furthermore, the regions of the same type may have various areas.

Figure 4A:
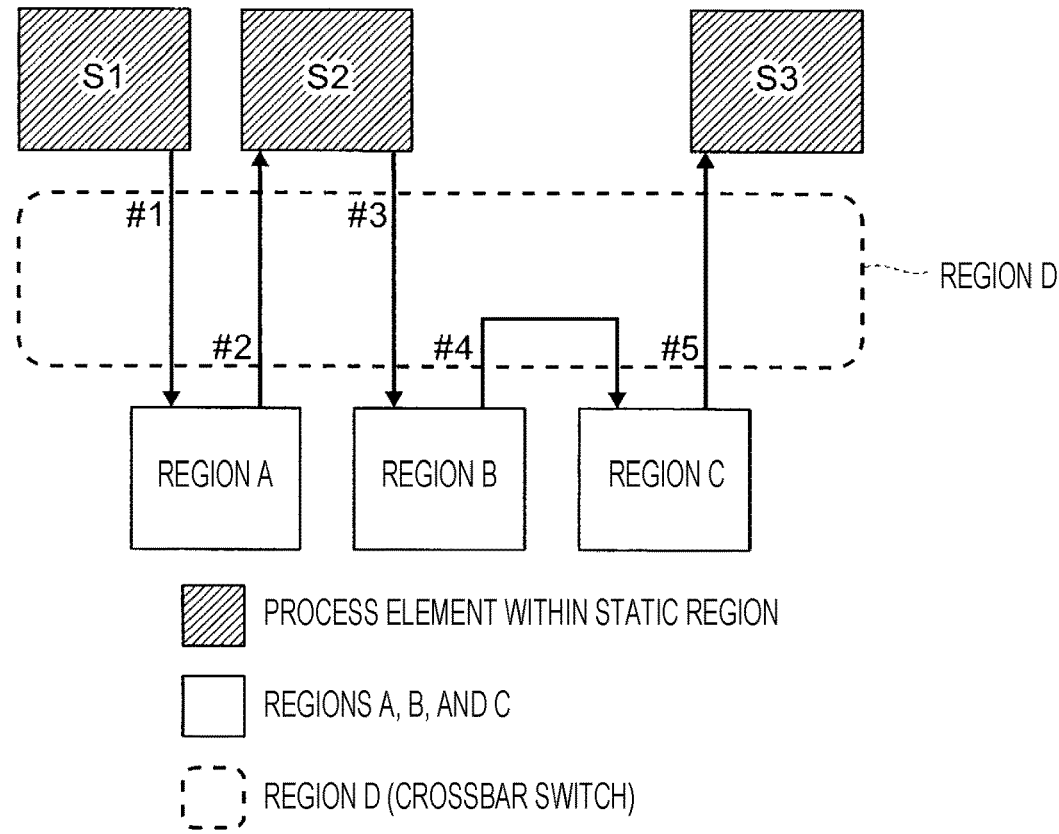
FIGS. 4A and 4B illustrate how the execution sequence of pipeline processes is changed by rewriting a crossbar switch, FIG. 4A illustrating the flow of data among regions before the connection of the crossbar switch is changed and FIG. 4B illustrating the flow of data among the regions after the connection of the crossbar switch has been changed.
Figure 4B:
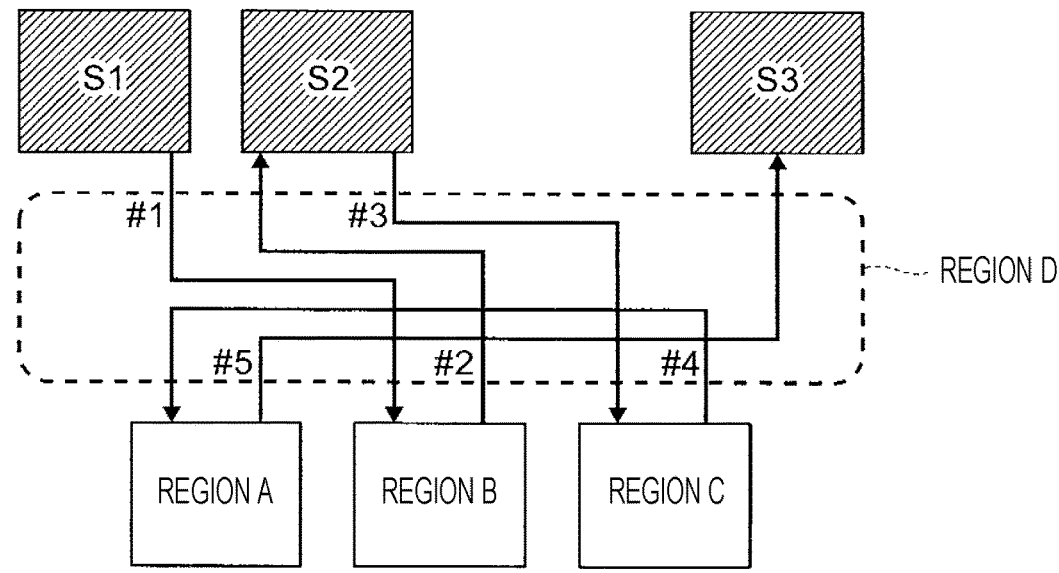

FIGS. 4A and 4B illustrate how the execution sequence of pipeline processes is changed by rewriting a crossbar switch. Specifically, FIG. 4A illustrates the flow of data among the regions before the connection of the crossbar switch is changed, and FIG. 4B illustrates the flow of data among the regions after the connection of the crossbar switch has been changed.

In FIGS. 4A and 4B, elements constituting the static region are distinguished from one another by being expressed as an element S1, an element S2, and an element S3. In the case of this exemplary embodiment, the elements S1, S2, and S3 are, for example, buffer circuits. Alternatively, the elements S1, S2, and S3 may be elements other than buffer circuits and may be associated with different processes.

In the example shown in FIGS. 4A and 4B, the sequence in which image data input to the image processor 3 (see FIG. 1) passes through the region has been changed from "element S1⇒region A⇒element S2⇒region B⇒region C⇒element S3" to "element S1⇒region B⇒element S2⇒region C⇒region A⇒element S3" as a result of changing the connection of the crossbar switch.

The changing of the crossbar switch is not executable when the image processor 3 is executing a job. In this case, a job is defined by a combination of the contents of processes and the execution sequence of the processes. A combination of the contents of processes and the execution sequence thereof that constitute a job vary depending on, for example, the type of image data to be processed. For example, the contents of a job vary depending on whether the image data is a photograph, text, or an image having a mixture of a photograph and text. An example of an image having a mixture of a photograph and text is a presentation document.

Process

The following description relates to a process executed by the image forming apparatus 1 (see FIG. 1). The image forming apparatus 1 is an example of an information processing apparatus.

Figure 5:
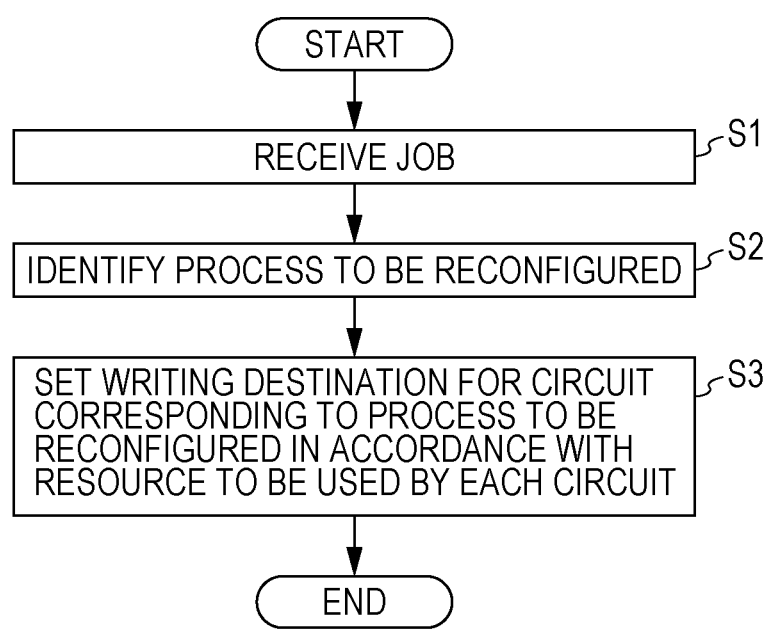
FIG. 5 is a flowchart illustrating a part of a process executed by a processor used in the first exemplary embodiment.

FIG. 5 is a flowchart illustrating a part of a process executed by the processor 2 (see FIG. 1) used in the first exemplary embodiment. In FIG. 5, reference sign S denotes a step. Alternatively, for rewriting the circuit configuration of the image processor 3 (see FIG. 1), a processor dedicated for rewriting may be used.

The process shown in FIG. 5 is realized by the processor 2 executing a program. The program in this case may be a part of firmware or may be a part of an application program.

When the processor 2 receives a job in step S1, the processor 2 identifies, in step S2, a process to be reconfigured from among processes to be executed by the image processor 3. The process is associated with a circuit configuration for realizing the process.

In step S3, the processor 2 sets a writing destination for the circuit corresponding to the process to be reconfigured in accordance with a resource to be used by each circuit. In the case of this exemplary embodiment, a resource refers to a memory region 31 (see FIG. 2) and a DSP region 32 (see FIG. 2).

FIG. 6 is a table illustrating the relationship between the characteristics of a resource used by a circuit corresponding to a process constituting each job and a reconfigurable region 34 (see FIG. 2) used as a writing destination.

In the example in FIG. 6, an expansion process, a gradation process, a screening process, and an edging process are indicated as examples of processes.

For example, a circuit corresponding to an expansion process has resource characteristics in which the circuit has memory access but has a small amount of calculation.

A circuit corresponding to a gradation process has resource characteristics in which the circuit has both a large amount of memory access and calculation.

A circuit corresponding to a screening process has resource characteristics in which the circuit has no memory access but has a large amount of calculation.

A circuit corresponding to an edging process has resource characteristics in which the circuit has both a large amount of memory access and calculation.

Therefore, the region A is set as a writing destination for the circuit corresponding to the expansion process. Likewise, the region B is set as a writing destination for the circuit corresponding to the gradation process, the region C is set as a writing destination for the circuit corresponding to the screening process, and the region B is set as a writing destination for the circuit corresponding to the edging process.

In the case of this exemplary embodiment, a writing destination is set in accordance with the characteristics of a resource to be used by each circuit, so that the resources of the reconfigurable regions 34 provided in the image processor 3 may be utilized effectively.

If a writing destination for a circuit corresponding to each element is set simply with reference to the area of the circuit, there is a possibility that the resource of a region serving as the writing destination is not utilized. In other words, there is a possibility that the resource may be wasted.

In contrast, as mentioned above, the processor 2 according to this exemplary embodiment prevents a resource from being wasted since a reconfigurable region 34 that is to serve as a writing destination is set in accordance with the characteristics of a resource to be used by a circuit corresponding to a process element. This is also effective for reducing the size of the FPGA constituting the image processor 3.

Next, a process for controlling the reconfiguration of the image processor 3 (see FIG. 1) will be described.

Figure 7:
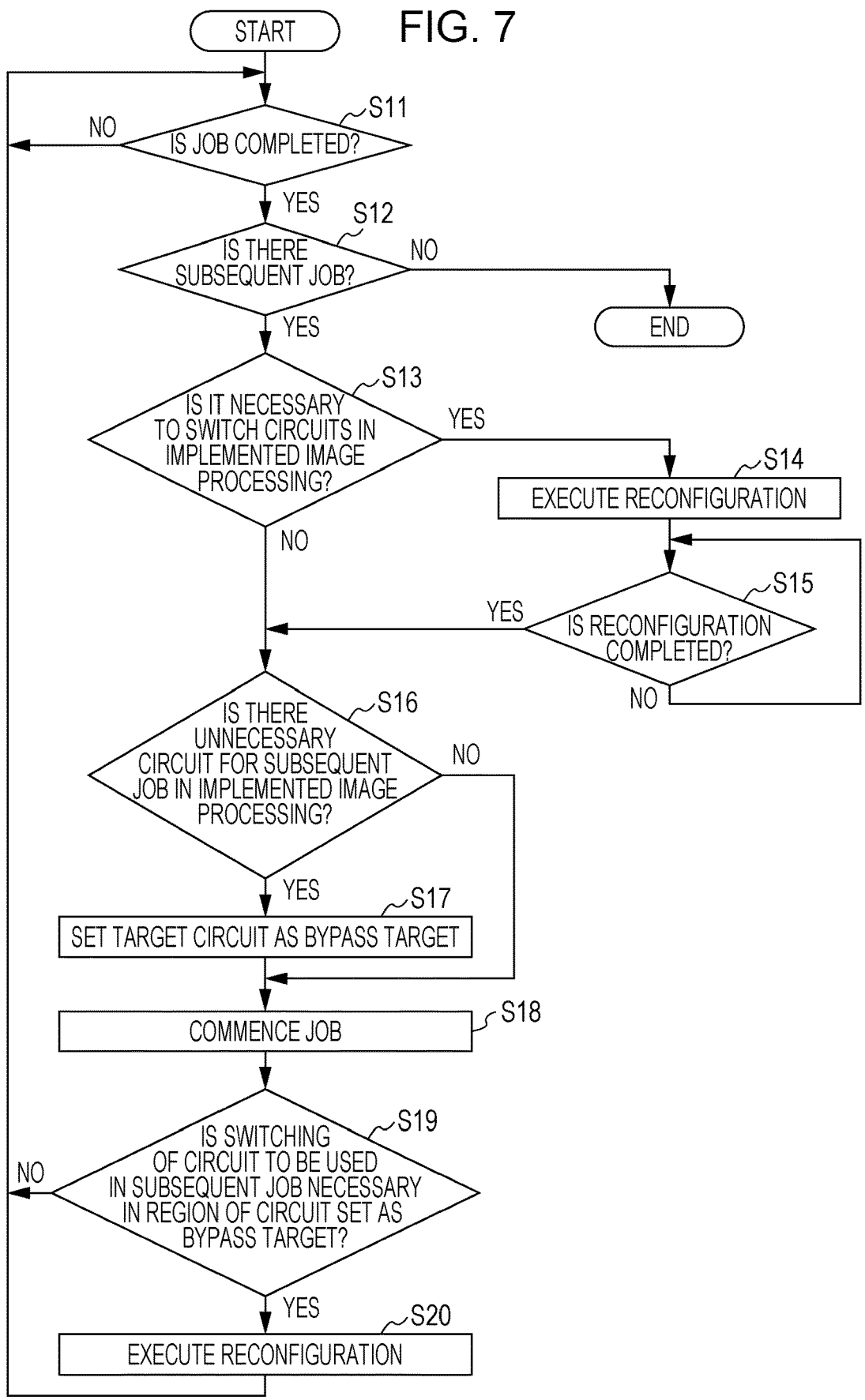
FIG. 7 is a flowchart illustrating an example of a process executed after the processor used in the first exemplary embodiment commences a job.

FIG. 7 is a flowchart illustrating an example of a process executed after the processor 2 (see FIG. 1) used in the first exemplary embodiment commences a job. In FIG. 7, reference sign S denotes a step.

First, in step S11, the processor 2 determines whether or not the current job is completed. If completion of the job is not confirmed, a negative result is obtained in step S11. In this case, the processor 2 repeats the determination process until completion of the job is confirmed. In contrast, when completion of the job is confirmed, a positive result is obtained in step S11.

When a positive result is obtained in step S11, the processor 2 determines in step S12 whether or not there is a subsequent job. The determination of whether or not there is a subsequent job may be executed before the job being executed is completed.

If there is no subsequent job, a negative result is obtained in step S12. In this case, the processor 2 ends the process for controlling the reconfiguration of the image processor 3. This is because it is not necessary to rewrite the reconfigurable regions 34 (see FIG. 2).

If there is a subsequent job, a positive result is obtained in step S12. In this case, the processor 2 determines in step S13 whether or not it may be necessary to change circuits in implemented image processing.

A case where it may be necessary to change circuits includes, for example, a case where a crossbar switch has to be reconfigured and a case where it may be necessary to set a reconfigurable region 34 in accordance with the characteristics of a resource to be used by a circuit. In other words, a case where it may be necessary to change circuits corresponds to a case where it may be necessary to perform rewriting that is not executable when a job is being executed.

If a positive result is obtained in step S13, the processor 2 executes reconfiguration of the image processor 3 in step S14. In this case, the reconfiguration is executed between the completed job and the subsequent job.

When the reconfiguration of the image processor 3 commences, the processor 2 determines in step S15 whether or not the reconfiguration is completed. A negative result is obtained in step S15 until completion of the reconfiguration is confirmed. In this case, the processor 2 repeats the determination process in step S15.

If completion of the reconfiguration is confirmed, a positive result is obtained in step S15.

If a negative result is obtained in step S13 or when a positive result is obtained in step S15, the processor 2 determines in step S16 whether or not there is an unnecessary circuit for a subsequent job in implemented image processing.

If there is an unnecessary circuit, a positive result is obtained in step S16. In this case, the processor 2 sets the target circuit as a bypass target in step S17. As described above with reference to FIG. 3A, the processor 2 changes the switch such that an output from the target circuit is not given to a subsequent circuit. In contrast, if there is no unnecessary circuit, a negative result is obtained in step S16.

If a negative result is obtained in step S16 or after step S17 is executed, the processor 2 commences a job in step S18. In this case, the job corresponds to the subsequent job in step S12.

When the job commences, the processor 2 determines in step S19 whether or not it may be necessary to change a circuit to be used in a subsequent job in the region of the circuit set as the bypass target. In this case, the subsequent job is a job subsequent to the currently-executed job commenced in step S18.

If it is not necessary to change the circuit, a negative result is obtained in step S19. In this case, the processor 2 returns to step S11.

If it may be necessary to change the circuit, a positive result is obtained in step S19. In this case, in step S20, the processor 2 reconfigures the region of the circuit set as a bypass target.

For example, in a state where the switch circuit 33 (see FIGS. 3A and 3B) connected between the input and output terminals of the region B is controlled to a bypass mode, the circuit in the region B is rewritten from a circuit corresponding to a gradation process to a circuit corresponding to an edging process. This rewriting process is executed concurrently with the execution of the job. Since the region of the relevant circuit is in a bypass mode even while the job is being executed, the circuit is reconfigurable. For reconfiguring the circuit, a data bus or an address bus disposed for reconfiguration is used.

After the reconfiguration, the processor 2 returns to step S11.

Specific Example of Process

The reconfiguration of the image processor 3 will be described below with reference to a specific example of a job.

Figure 8:
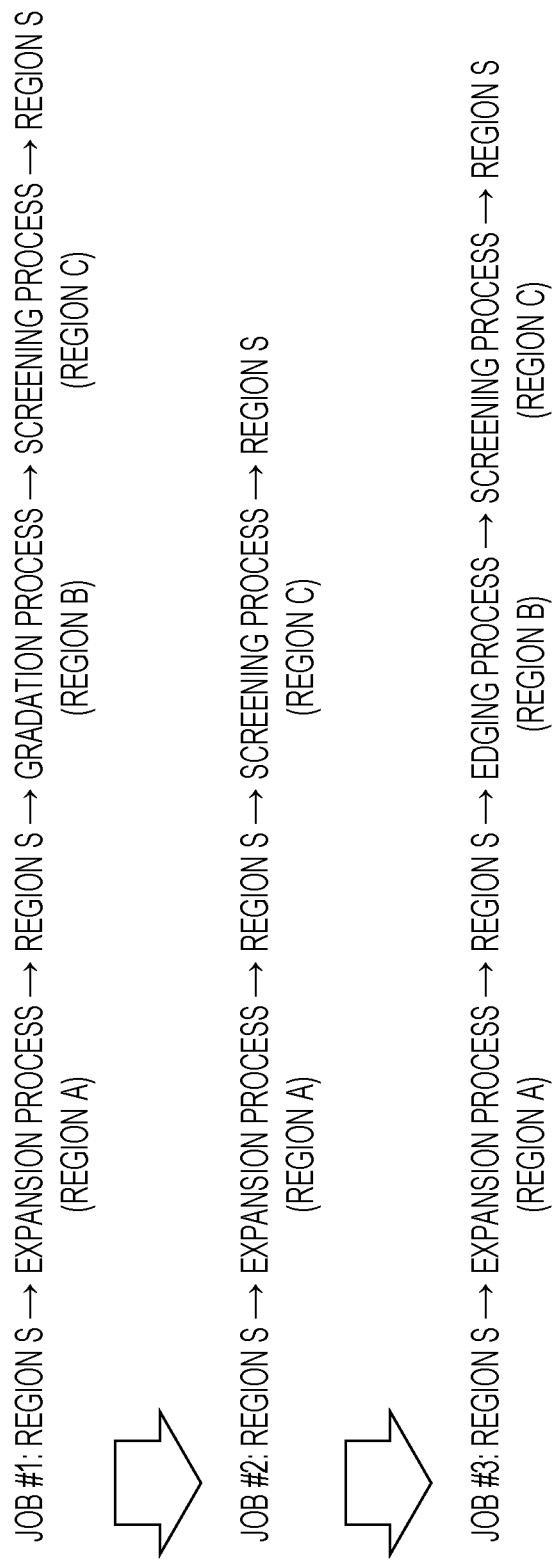
FIG. 8 illustrates process elements constituting each job and the execution sequence in a case where three jobs are scheduled to be executed in the image forming apparatus.

FIG. 8 illustrates process elements constituting each job and the execution sequence in a case where three jobs are scheduled to be executed in the image forming apparatus (see FIG. 1).

In the case of FIG. 8, job #1, job #2, and job #3 are scheduled to be executed. The execution sequence is as follows: job #1, job #2, and job #3.

Job #1 is constituted of a process using a static region S, an expansion process using the region A, a process using the static region S, a gradation process using the region B, a screening process using the region C, and a process using the static region S. The region A, the region B, and the region C correspond to the reconfigurable regions 34 shown in FIG. 2.

Job #2 is constituted of a process using the static region S, an expansion process using the region A, a process using the static region S, a screening process using the region C, and a process using the static region S. The difference from job #1 is that a gradation process is not executed.

Job #3 is constituted of a process using the static region S, an expansion process using the region A, a process using the static region S, an edging process using the region B, a screening process using the region C, and a process using the static region S. The difference from job #2 is that the edging process using the region B has been added.

Before each job commences, the circuit configuration of the image processor 3 has to be reconfigured in accordance with the job to be commenced.

Figure 9:
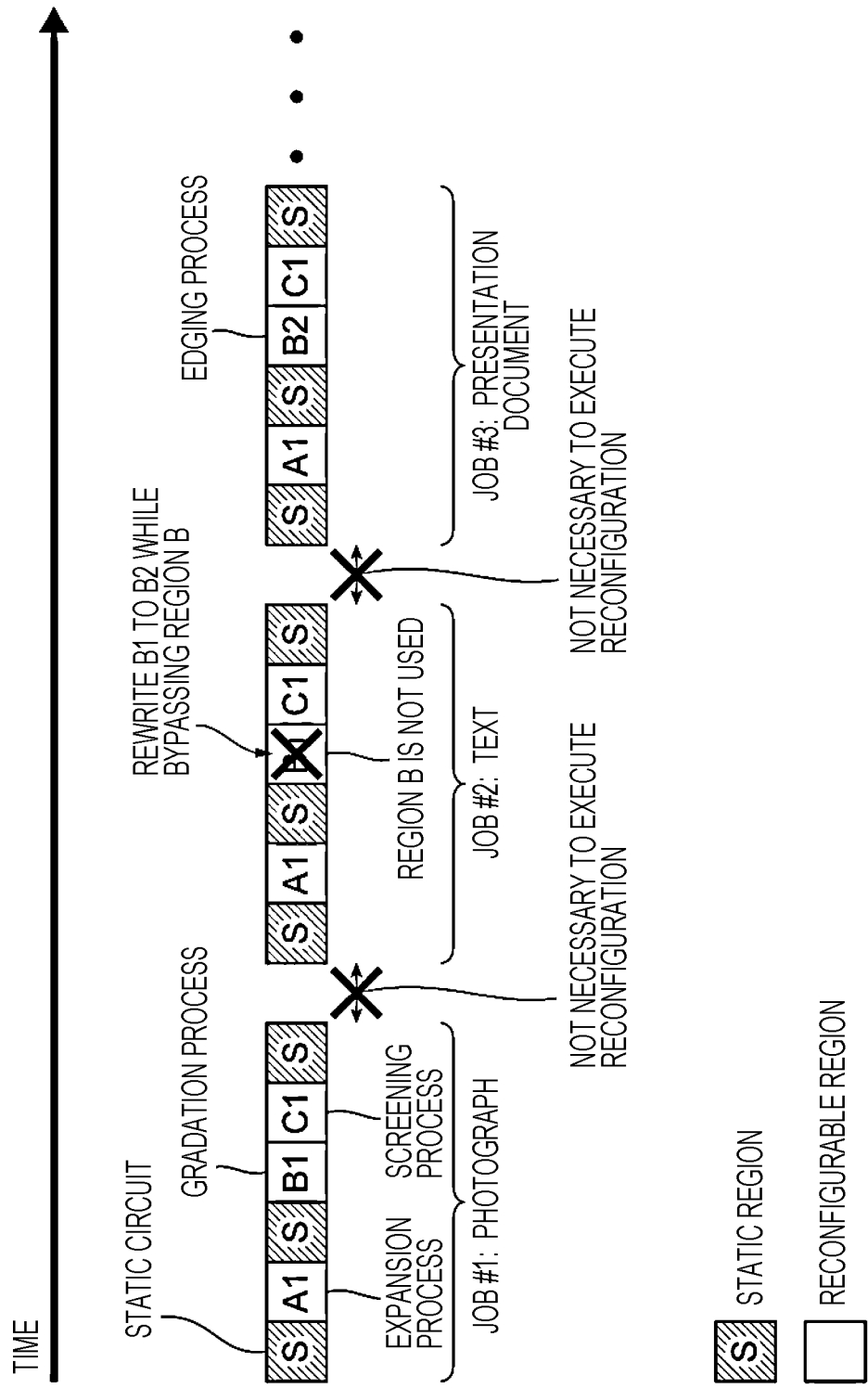
FIG. 9 illustrates the timing at which the image processor is reconfigured for executing the three jobs, and the contents of the reconfiguration.

FIG. 9 illustrates the timing at which the image processor 3 is reconfigured for executing the three jobs, and the contents of the reconfiguration.

Job #1, job #2, and job #3 correspond to the jobs described with reference to FIG. 8. In FIG. 9, a static circuit using the static region S is denoted by a reference sign S, and a circuit using a reconfigurable region 34 is denoted by a combination of a reference sign of a region serving as the writing destination and a number. For example, A1 denotes a circuit 1 to be written in the region A. In the case of FIG. 9, a circuit corresponding to a gradation process is denoted by B1, and a circuit corresponding to an edging process is denoted by B2.

In job #1 that deals with image data corresponding to a photograph, since there is no job executed prior thereto, the image processor 3 is reconfigured before job #1 commences.

In the case of FIG. 9, since job #2 is executed subsequently to job #1, the processor 2 obtains a positive result in step S12 (see FIG. 7). The process elements required in job #2 are such that the gradation process has been excluded from the implemented image processing in job #1. In this case, the gradation process is implemented in the region B. Therefore, the processor 2 sets the region B having the circuit B1 corresponding to the gradation process written therein as the bypass target in step S17 (see FIG. 7).

When job #2 commences, the processor 2 checks the configuration of job #3 to be subsequently executed. In the case of job #3 shown in FIG. 9, an edging process has to be executed in the region B. Thus, the processor 2 obtains a positive result in step S19 (see FIG. 7) and rewrites the circuit B1 in the region B set in the bypass mode to a circuit B2 corresponding to an edging process while job #2 is being executed.

In the case of FIG. 9, after job #2 is completed, the processor 2 controls the switch circuit 33 such that job #3 may be commenced by simply controlling the region B from the bypass mode to the non-bypass mode. The changing of the switch of the switch circuit 33 is completed within a short period of time, unlike in the reconfiguration of a reconfigurable region 34.

Accordingly, in the example shown in FIG. 9, the image processor 3 does not have to be reconfigured between job #1 and job #2, as well as between job #2 and job #3. In other words, the reconfiguration of the image processor 3 is hidden from the user.

Therefore, the time period from when job #1 ends to when job #2 commences may be shortened, as compared with a case where the image processor 3 is reconfigured by using the time period from when job #1 ends to when job #2 commences. Likewise, the time period from when job #2 ends to when job #3 commences may be shortened, as compared with a case where the image processor 3 is reconfigured by using the time period from when job #2 ends to when job #3 commences.

The effect of the shortened time period from when one job ends to when a subsequent job commences is more prominent as the number of jobs to be executed increases. In other words, by using the image forming apparatus 1 according to this exemplary embodiment, deterioration in the image forming performance may be suppressed, as compared with a case where the image processor 3 described above is not used. This implies that, by using the image forming apparatus 1 according to this exemplary embodiment, the number of jobs to be executed within a unit time may be increased, as compared with a case where the image processor 3 described above is not used.

FIG. 10 illustrates a case where the image processor 3 is reconfigured between jobs.

In the case of FIG. 10, with regard to job #12 to be executed subsequently to job #11, an implemented circuit A1 to be written in the region A among the reconfigurable regions 34 (see FIG. 2) has to be rewritten to a circuit A2. In the case of FIG. 10, with regard to job #11, the circuit A1 written in the region A has to be executed. Therefore, the region A is not reconfigurable when the job #11 is being executed, as in FIG. 9.

In this case, the processor 2 obtains a positive result in step S13 (see FIG. 7) and reconfigures the image processor 3 upon completion of job #11. In the case of job #11 and job #12 shown in FIG. 10, the configuration is the same except for the circuit A2. Therefore, the crossbar switch does not have to be reconfigured. In other words, the configuration of the crossbar switch is used without being changed.

FIG. 11 illustrates another case where the image processor 3 is reconfigured between jobs.

In the case of FIG. 11, the contents of circuits constituting job #13 to be executed subsequently to job #11 are the same as those of job #11. Specifically, job #13 also uses circuits A1, B1, and C1. However, the execution sequence of the circuits in job #13 is different from the execution sequence of the circuits in job #11. Therefore, the crossbar switch has to be reconfigured. As mentioned above, the crossbar switch is not reconfigurable when a job is being executed.

In this case, the processor 2 similarly obtains a positive result in step S13 (see FIG. 7) and reconfigures the image processor 3 upon completion of job #11. In detail, the crossbar switch alone is reconfigured, and the execution sequence of the circuits is rearranged.

Other Exemplary Embodiments

Although an exemplary embodiment of the present disclosure has been described above, the technical scope of the disclosure is not limited to the scope defined in the above exemplary embodiment. It is obvious from the scope defined in the claims that various modifications and alterations added to the above exemplary embodiment are included in the technical scope of the disclosure.

For example, as an alternative to the above-described first exemplary embodiment in which the image forming apparatus 1 (see FIG. 1) is described as an example of an information processing apparatus, an apparatus that executes multiple jobs and that has to reconfigure the circuits of the image processor 3 for every job is included as an information processing apparatus.

In the first exemplary embodiment described above, memory regions 31 (see FIG. 2) and DSP regions 32 (see FIG. 2) are described as an example of resources to be used by circuits corresponding to process elements to be reconfigured. Alternatively, other resource characteristics may be taken into account. Furthermore, even in a case where the memory regions 31 and the DSP regions 32 are to be taken into account, if regions where the reconfigurable regions 34 are usable have differences in performance, the writing destination for a circuit to be reconfigured may be set by including not only the resources but also the differences in performance.

In the first exemplary embodiment described above, the processor 2 in the image forming apparatus 1 controls the reconfiguration of the image processor 3. Alternatively, a processor in another external apparatus, such as a server, which controls the image forming apparatus 1 from the outside, may control the reconfiguration of the image processor 3.

In the first exemplary embodiment described above, the term "processor" refers to a processor in a broad sense. Examples of the processor include general processors (e.g., CPU: Central Processing Unit) and dedicated processors (e.g., GPU: Graphics Processing Unit, ASIC: Application Integrated Circuit, FPGA: Field Programmable Gate Array, and programmable logic device).

In the first exemplary embodiment described above, the term "processor" is broad enough to encompass one processor or plural processors in collaboration which are located physically apart from each other but may work cooperatively. The sequence of operations of the processor is not limited to one described in the first exemplary embodiment above, and may be changed.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. An information processing apparatus comprising:
   a dynamic reconfiguration device having a first region with a static configuration, a second region with a changeable configuration, a switch used for bypassing between input and output terminals of the second region, and a crossbar switch used for switching a connection between the first region and the second region; and
   a processor configured to set a writing destination for a circuit to be reconfigured based on a resource to be used by the circuit if the circuit is to be written in the second region.

2. The information processing apparatus according to claim 1,
   wherein the crossbar switch is provided in the second region.

3. The information processing apparatus according to claim 2,
wherein the switching of the crossbar switch is executed between a current pipeline process and a subsequent pipeline process.

4. The information processing apparatus according to claim 1,
wherein the processor commands the dynamic reconfiguration device to switch the crossbar switch in accordance with a position of the second region in which the circuit is to be written.

5. The information processing apparatus according to claim 4,
wherein the switching of the crossbar switch is executed between a current pipeline process and a subsequent pipeline process.

6. The information processing apparatus according to claim 1,
wherein if a circuit not to be used in a subsequent pipeline process is written in a partial region of the second region, the processor controls the switch corresponding to the partial region to a bypass mode while the subsequent pipeline process is being executed.

7. The information processing apparatus according to claim 6,
wherein if the partial region of the second region is controlled to the bypass mode and a circuit to be used in the subsequent pipeline process is writable in the partial region, the processor gives a command for writing the circuit in the partial region during a current pipeline process.

8. A dynamic reconfiguration device comprising:
a first region with a static configuration;
a second region with a changeable configuration
a switch used for bypassing between input and output terminals of the second region; and
a crossbar switch used for switching a connection between the first region and the second region,
wherein, in accordance with external control, a circuit to be reconfigured is written in the second region according to a resource to be used by the circuit.

9. The dynamic reconfiguration device according to claim 8,
wherein the crossbar switch is switched such that the circuit written in the second region executes a process in accordance with a predetermined sequence.

10. A non-transitory computer readable medium storing a program causing a computer to execute a process, the computer controlling a dynamic reconfiguration device having a first region with a static configuration, a second region with a changeable configuration, a switch used for bypassing between input and output terminals of the second region, and a crossbar switch used for switching a connection between the first region and the second region, the process comprising:
acquiring a resource to be used by a circuit to be reconfigured; and
setting a writing destination for the circuit based on the resource to be used by the circuit.

11. An information processing apparatus comprising:
dynamic reconfiguration means having a first region with a static configuration, a second region with a changeable configuration, a switch used for bypassing between input and output terminals of the second region, and a crossbar switch used for switching a connection between the first region and the second region; and
processing means for setting a writing destination for a circuit to be reconfigured based on a resource to be used by the circuit if the circuit is to be written in the second region.

* * * * *